United States Patent [19]

Matsuoka

[11] Patent Number: 5,443,404
[45] Date of Patent: Aug. 22, 1995

[54] SOCKET FOR ELECTRIC PART

[75] Inventor: Noriyuki Matsuoka, Yokohama, Japan

[73] Assignee: Yamaichi Electronics Co., Ltd., Tokyo, Japan

[21] Appl. No.: 162,325

[22] Filed: Dec. 7, 1993

[30] Foreign Application Priority Data

Dec. 7, 1992 [JP] Japan .................................. 4-351764

[51] Int. Cl.⁶ .............................................. H01R 9/22
[52] U.S. Cl. ...................................... 439/717; 439/70; 439/331
[58] Field of Search ............... 439/70, 71, 330, 331, 439/717, 72, 262, 263, 525, 526, 264, 265

[56] References Cited

U.S. PATENT DOCUMENTS

| | | | |
|---|---|---|---|
| 4,070,086 | 1/1978 | Trafford | 439/717 |
| 4,184,733 | 1/1980 | Schmeling | 439/717 |
| 4,550,959 | 11/1985 | Grabbe et al. | 439/717 |
| 4,820,169 | 4/1989 | Weber et al. | 439/717 |
| 4,872,855 | 10/1989 | Norden | 439/717 |

*Primary Examiner*—Larry L. Schwartz
*Assistant Examiner*—Hien D. Vu
*Attorney, Agent, or Firm*—Wenderoth, Lind & Ponack

[57] ABSTRACT

A socket, a plurality of which are to be arranged in a row on a wiring board, comprises hook-like engagement elements formed on opposite side surfaces thereof along a direction of the row. Each of the hook-like engagement elements is engagable with a counterpart of an adjacent socket, and a clearance is formed between each of the hook-like engagement elements and the counterpart of the adjacent socket.

8 Claims, 4 Drawing Sheets

SOCKET FOR ELECTRIC PART

BACKGROUND OF THE INVENTION

1. Field of the Invention

This invention relates to a socket for an electric part, a plurality of which are to be adjacently arranged in a row on a wiring board.

2. Prior Art

In a burn-in test of integrated circuits (IC), a plurality of IC sockets are mutually adjacently arranged in a row on a wiring board, and an IC is loaded on each of these sockets by a robot so as to be carried into a test furnace and tested at a high temperature. Heretofore, the plurality of IC sockets inserted into through-holes formed in the wiring board are soldered in the through-holes, with the opposing side surfaces of adjacent sockets intimately contacted with each other under pressure, and an access position for the robot is established with reference to the dimension of each socket in a direction along the row.

However, in the above burn-in test, the sockets are readily expanded by heat. Due to this thermal expansion, overload is often applied to the soldering portions between the contacts of the sockets and the wiring board. As a result, the soldering is damaged (inferior connection), and a warping problem occurs because expansion of the individual sockets cannot be absorbed.

SUMMARY OF THE INVENTION

It is therefore a general object of the invention to provide a socket for an electric part, in which the above-mentioned warping and the possible damage to the solder at an area of connection can be prevented effectively.

According to the present invention, there is provided, in order to achieve the above object, a socket, a plurality of which are to be arranged in a row on a wiring board, comprising hook-like engagement elements formed on opposite side surfaces thereof along a direction of the row, each of the hook-like engagement elements being engagable with a counterpart of an adjacent socket, and a clearance being formed between each of the hook-like engagement elements and the counterpart of the adjacent socket.

After the sockets having the above-mentioned construction are adjacently arranged on the wiring board such that each of the vertically oppositely directed hook-like engagement elements is in engagement with a counterpart of an adjacent socket, the sockets are pulled in a direction away from each other so that the mating hook-like engagement elements may be intimately engaged with each other, leaving no room for play. By doing this, the mounting positions of the respective sockets are set at equal pitches. Thereafter, the contacts of the respective sockets are soldered in the through-holes formed in the wiring board. The IC sockets are subjected to the burn-in test, etc. in that condition.

Although the sockets are expanded because they are exposed to high temperature in the burn-in furnace, this thermal expansion is favorably absorbed by the engagement between the vertically oppositely directed hook-like engagement elements of two adjacent sockets. Accordingly, expansion of each socket will not create a load against its adjacent socket. As a result, there can be effectively prevented the warping and the damage to the solder at the area of connection, which would otherwise occur due to multiplexing of thermal expansion of the respective sockets especially as multiplied and applied to the sockets on the opposite ends of the row.

DETAILED DESCRIPTION OF THE EMBODIMENT

One embodiment of the present invention will be described with reference to FIGS. 1 to 5.

Figure 1:
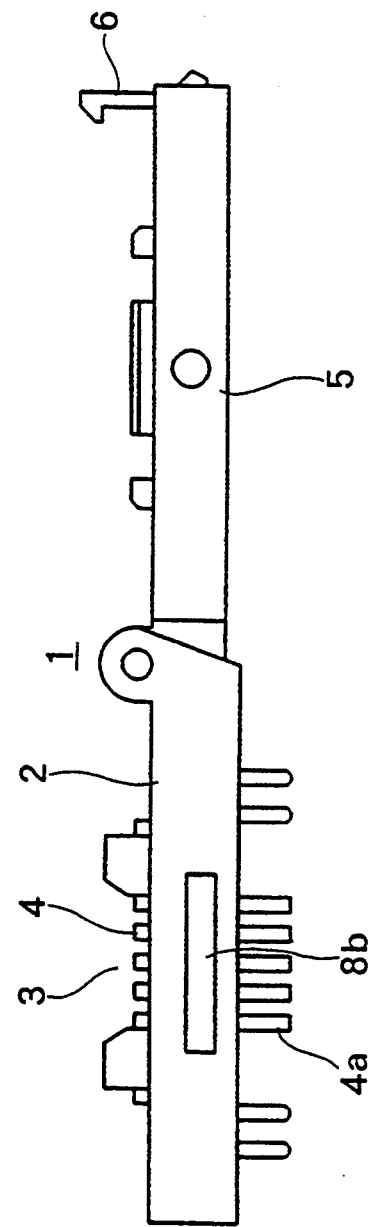
FIG. 1 is a side view of a socket for an electric part according to one embodiment of the present invention.

As exemplarily shown in FIG. 1, a socket for an electric part includes a plurality of contacts 4 arranged around an electric part loading portion 3. The electric part loaded on the loading portion 3 in such a manner as to contact with the contacts is pressed by a presser cover 5, which is pivotally supported on one end of the socket body 2, when closed relative to the socket body 2, in order to realize a reliable contacting condition.

Figure 2:
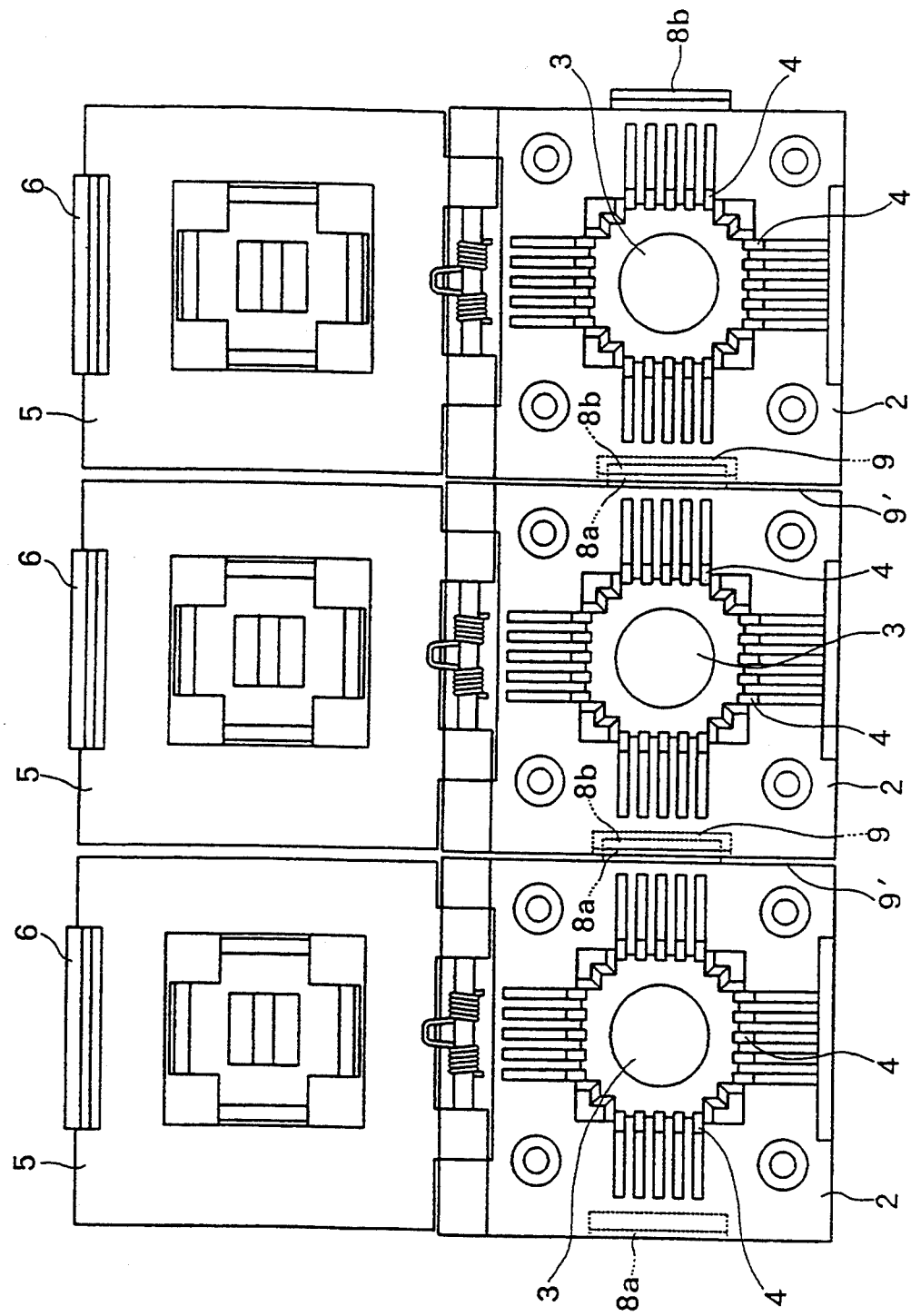
FIG. 2 is a plan view showing a plurality of sockets for an electric part adjacently arranged in a row on a wiring board.
Figure 3:
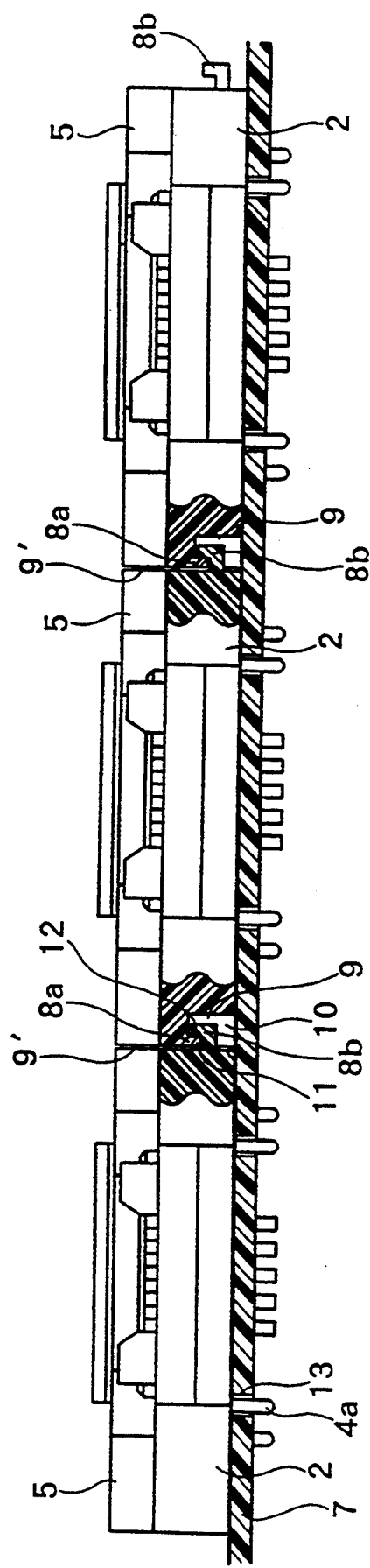
FIG. 3 is a front view, partly cut-away, of the sockets adjacently arranged on the wiring board.

As shown in FIGS. 2 and 3, the sockets 1 are loaded and adjacently arranged in a row on a wiring board 7. Vertically oppositely directed hook-like engagement elements 8a and 8b are formed on opposite side surfaces of each socket body 2 along a direction of the row (i.e. along a first direction). A clearance 9 is formed between the engagement elements 8a and 8b of adjacent socket bodies 2 the direction of the row. The hook-like engagement elements 8a and 8b are formed on the opposite side surfaces of the socket body 2 such that the hook-like elements 8a and 8b open in vertically opposite directions.

Figure 4:
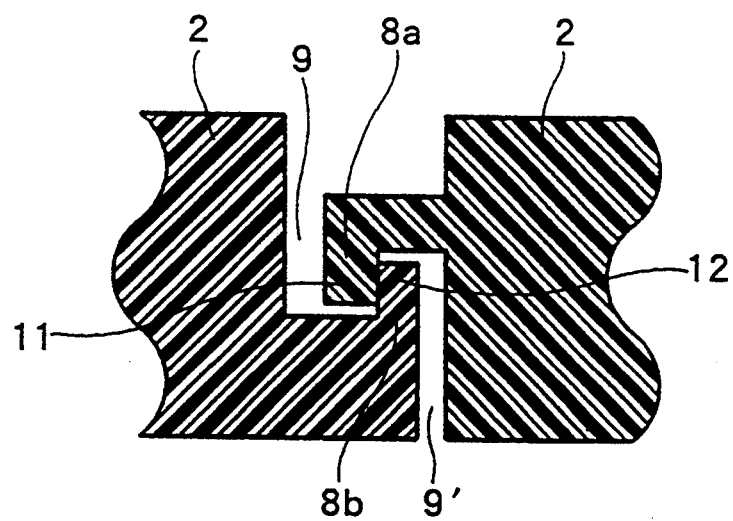
FIG. 4 is a sectional view showing vertically oppositely directed hook-like engagement elements being in intimate engagement with each other.
Figure 5:
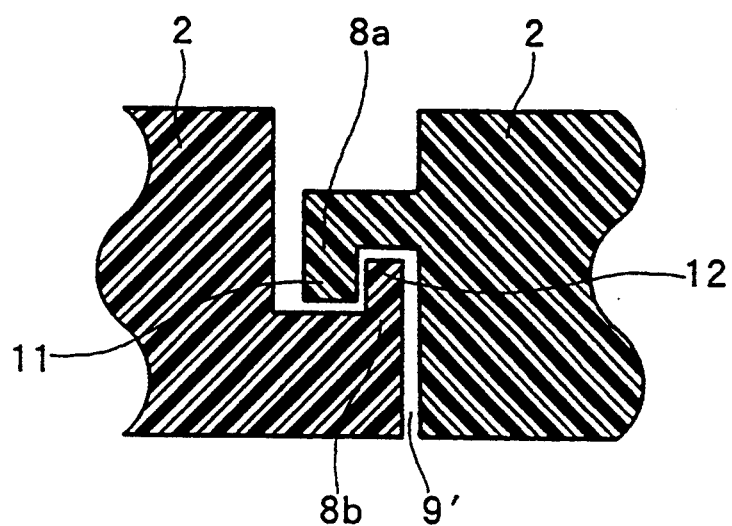
FIG. 5 is a sectional view showing the vertically oppositely directed hook-like engagement elements being in engagement with each other when the sockets are thermally expanded.

One concrete structure of the hook-like engagement elements 8a and 8b will be exemplified. The socket body 2 has a hole 10, with a bottom opening to a rear surface (loading surface of the wiring board), is formed in one side surface of the socket body 2. That is, the hole 10 opens through bath the side and bottom of the socket body 2, as shown in FIGS. 3–5. An engagement piece 11 extends perpendicularly downwardly from an upper wall of the hole 10 along the side surface of the socket body 2 to form the hook-like engagement element 8a. Another engagement piece 12 extends upwardly from the other side surface of the socket body 2 to form the hook-like engagement element 8b. Lower ends of the contacts 4 of each socket 1 extends downwardly from a lower surface of the socket body 2 to form male terminals 4a, respectively. The sockets 1 are adjacently arranged in a row on the wiring board 7 with the male terminals 4a inserted into through-holes 13 formed on the wiring board 7. The downwardly directing engagement piece 11 of the engagement element 8a formed on the above-mentioned one side surface of the socket body 2 is engaged by the upwardly directing engagement piece 12 of the engagement element 8b formed on the other side surface of the adjacent socket body 2.

Similarly, the upwardly directing engagement piece 12 of the engagement element 8b formed on the other side surface of the socket body 2 is engaged by the downwardly directing engagement piece 11 of the engagement element 8a formed on the above-mentioned one side surface of the adjacent socket body 2. In the same manner, a plurality of such sockets 1 are adjacently arranged in a row on the upper surface of the wiring board 7. Room for play is formed between each through-hole 13 of the wiring board 7 and each male terminal 4a. Accordingly, the respective sockets 1 can be very slightly moved in the direction of the row within the range of the clearance 9 formed between the vertically oppositely directed engagement elements 8a and 8b of the adjacent sockets 1.

As mentioned above, the sockets 1 are inserted into the through-holes 13 of and adjacently arranged in a row on the wiring board 7, and the hook-like engagement elements 8a and 8b are brought into engagement with each other. In that condition, the sockets 1 on opposite ends are pulled in the row direction of the row so as to very slightly move the sockets 1 in the same direction within the range allowed by the clearance 9, thereby intimately engaging the engagement pieces 11 and 12 and forming a clearance 9' between the adjacent socket bodies 2. As a result, the loading positions of the sockets 1 are set and the respective sockets 1 are loaded at equal pitches. In that condition, the male terminals 4a of the respective sockets 1 are soldered in the through-holes on the wiring board 7 and fixedly connected to the wiring board 7.

Although the respective sockets 1 are expanded when they are exposed to high temperature in the burn-in furnace, this thermal expansion is favorably absorbed by the clearance 9 formed between the hook-like engagement elements 8a and 8b which are in engagement relation to each other, and also by the clearance 9' formed between the adjacent socket bodies 9. Accordingly, the problem of expansion of each socket such that it creates a load against its adjacent socket can be obviated.

In the above embodiment, the hook-like engagement elements 8a and 8b are formed on opposite side surfaces of the socket body 2. Alternatively, the engagement elements 8a and 8b may be formed on opposite side surfaces of the presser cover 5. In this sense, the engagement elements 8a and 8b may be formed on opposite side surfaces of the socket 1 which consists of the socket body 2 and the presser cover 5, so that each of the engagement elements 8a and 8b may engage a counterpart of the adjacent socket 1.

After the above-mentioned sockets are adjacently arranged on the wiring board such that each of the vertically oppositely directed hook-like engagement elements is in engagement with a counterpart of the adjacent socket, the sockets are pulled in a direction away from each other so that the mating hook-like engagement elements may be intimately engaged with each other, leaving no room for play. By doing this, the mounting positions of the respective sockets are set at equal pitches. As a result, even if the respective sockets are expanded when they are exposed to high temperature in the burn-in furnace, this thermal expansion is favorably absorbed by the clearance formed between the hook-like engagement elements which are in engaged relation to each other as shown in FIG. 5. Accordingly, expansion of each socket will not create a load against to its adjacent socket. As a result, there can be effectively prevented the warping and the damage to the solder at the area of connection, which would otherwise occur due to the thermal expansion of the respective sockets, especially as multiplied and applied to the sockets on the opposite ends of the row. Therefore, the access position (center of the access) of the robot for mounting the electric part can be appropriately maintained.

What is claimed is:

1. An apparatus comprising:
 a socket having first and second sides opposite one another along a first direction;
 a first engagement hook structure provided on said first side of said socket;
 a second engagement hook structure provided on said second side of said socket;
 wherein said first engagement hook structure constitutes a means for engaging with a third engagement hook structure of an adjacent socket member, wherein the third engagement hook structure is identical in size and shape to said second engagement hook structure, with a clearance between said first engagement hook structure and the third engagement hook structure to allow for relative movement in the first direction between said first engagement hook structure and the third engagement hook structure so as to allow for thermal expansion of said socket;
 wherein said second engagement hook structure constitutes a means for engaging with a fourth engagement hook structure of an adjacent socket member, wherein the fourth engagement hook structure is identical in size and shape to said first engagement hook structure, with a clearance between said second engagement hook structure and the fourth engagement hook structure to allow for relative movement in the first direction between said second engagement hook structure and the fourth engagement hook structure so as to allow for thermal expansion of said socket;
 wherein said socket comprises an electrical socket for receiving an electrical component; and
 wherein said electrical socket is adapted to be mounted on a horizontal wiring board as part of a row of a plurality of electrical sockets.

2. An apparatus as recited in claim 1, wherein
 said first and second engagement hook structures comprise first and second hooks, respectively, vertically oppositely directed relative to one another.

3. An apparatus as recited in claim 1, wherein
 said socket comprises a socket body and a presser cover movably mounted to said socket body; and
 said first and second engagement hook structures are provided on first and second opposite sides of said socket body, respectively.

4. An apparatus as recited in claim 3, wherein
 said electrical socket includes a socket body having an electrical part loading portion, and a presser cover movably mounted to said socket body.

5. An apparatus comprising:
 a plurality of sockets adapted to be arranged on a wiring board in a row extending in a first direction, each of said sockets having first and second sides opposite one another along the first direction;
 first engagement hook structures provided on said first sides of said sockets, respectively;
 second engagement hook structures provided ok said second sides of said sockets, respectively;

wherein, for each of said sockets, said first engagement hook structure constitutes a means for engaging with said second engagement hook structure of an adjacent one of said sockets with a clearance between the mutually engaged said first and second engagement hook structures to allow for relative movement in the first direction between the mutually sneaked said first and second hook structures so as to allow for thermal expansion of said sockets;

wherein, for each of said sockets, said second engagement hook structure constitutes a means for engaging with said first engagement hook structure of an adjacent one of said sockets with a clearance between the mutually engaged said second and first engagement hook structures to allow for relative movement in the first direction between the mutually engaged said second and first engagement hook structures allow for thermal expansion of said sockets;

wherein said first and second engagement hook structures together constitute a means for connecting said sockets in a horizontal row in such a manner that said sockets can be spaced apart from one another at equal intervals by pulling endmost sockets of the horizontal row of said sockets away from one another until said first and second engagement hook structures abut one another and prevent further pulling; and wherein each of said sockets comprises an electrical socket for receiving a an electrical component.

6. An apparatus as recited in claim 3, wherein
said first and second engagement hook structures comprise first and second hooks, respectively, vertically oppositely directed relative to one another.

7. An apparatus as recited in claim 5, wherein
each of said sockets comprises a socket body and a presser cover movably mounted to said socket body; and for each of said sockets, said first and second engagement hook structures are provided on first and second opposite sides of said socket body, respectively.

8. An apparatus as recited in claim 5, wherein
each of said electrical sockets includes a socket body having an electrical part loading portion, and a presser cover movably mounted to said socket body.

* * * * *